(12) United States Patent
Park et al.

(10) Patent No.: US 8,212,212 B2
(45) Date of Patent: Jul. 3, 2012

(54) THERMOELECTRIC DEVICE AND METHOD OF FORMING THE SAME, TEMPERATURE SENSING SENSOR, AND HEAT-SOURCE IMAGE SENSOR USING THE SAME

(75) Inventors: Young Sam Park, Daejeon (KR); Moon Gyu Jang, Daejeon (KR); Younghoon Hyun, Seoul (KR); Myungsim Jun, Daejeon (KR); Sang Hoon Cheon, Daejeon (KR); Taehyoung Zyung, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/987,459

(22) Filed: Jan. 10, 2011

(65) Prior Publication Data
US 2011/0198498 A1    Aug. 18, 2011

(30) Foreign Application Priority Data

Feb. 16, 2010 (KR) .................. 10-2010-0013877
Sep. 8, 2010 (KR) .................. 10-2010-0088107

(51) Int. Cl.
G02F 1/01 (2006.01)
(52) U.S. Cl. ..................................... 250/330
(58) Field of Classification Search .... 250/338.1–338.5, 250/330
See application file for complete search history.

(56) References Cited

U.S. PATENT DOCUMENTS

| | | | |
|---|---|---|---|
| 6,605,772 | B2 | 8/2003 | Harman et al. |
| 2005/0142766 | A1* | 6/2005 | Hareland et al. ............. 438/268 |
| 2006/0281321 | A1 | 12/2006 | Conley, Jr. et al. |
| 2009/0020148 | A1 | 1/2009 | Boukai et al. |

FOREIGN PATENT DOCUMENTS

| | | |
|---|---|---|
| KR | 10-0906154 A | 6/2009 |
| KR | 2010-0040482 A | 4/2010 |

OTHER PUBLICATIONS

Wang et al., "A new type of low power thermoelectric micro-generator fabricated by nanowire array thermoelectric material," 2005, Microelectronic Engineering, vol. 77, pp. 223-229.*
Akram I. Boukai, et al., "Silicon nanowires as efficient thermoelectric materials", nature 06458, Jan. 10, 2008, vol. 451, pp. 168-171.
Allon I. Hochbaum, et al., "Enhanced thermoelectric performance of rough silicon nanowires", nature 06381, Jan. 10, 2008, vol. 451, pp. 163-168.

* cited by examiner

*Primary Examiner* — Kiho Kim
(74) *Attorney, Agent, or Firm* — Rabin & Berdo, P.C.

(57) ABSTRACT

Provided are a thermoelectric device and a method of forming the same, a temperature sensing sensor, and a heat-source image sensor using the same. The thermoelectric device includes a first nanowire and a second nanowire, a first silicon thin film, a second silicon thin film, and a third silicon thin film. The first nanowire and a second nanowire are disposed on a substrate. The first nanowire and the second nanowire are separated from each other. The first silicon thin film is connected to one end of the first nanowire. The second silicon thin film is connected to one end of the second nanowire. The third silicon thin film is connected to the other ends of the first nanowire and the second nanowire. The first and second nanowires extend in a direction parallel to an upper surface of the substrate.

15 Claims, 11 Drawing Sheets

THERMOELECTRIC DEVICE AND METHOD OF FORMING THE SAME, TEMPERATURE SENSING SENSOR, AND HEAT-SOURCE IMAGE SENSOR USING THE SAME

CROSS-REFERENCE TO RELATED APPLICATIONS

This U.S. non-provisional patent application claims priority under 35 U.S.C. §119 of Korean Patent Application Nos. 10-2010-0013877, filed on Feb. 16, 2010, and 10-2010-0088107, filed on Sep. 8, 2010, the entire contents of which are hereby incorporated by reference.

BACKGROUND OF THE INVENTION

The present invention disclosed herein relates to a thermoelectric device and a method of forming the same, and a temperature sensing sensor and a heat-source image sensor using the same, and more particularly, to a thermoelectric device, a temperature sensing sensor, and a heat-source image sensor using a nanowire.

A thermoelectric device, which converts thermal energy into electrical energy, belongs to one of representative technology fields that can satisfy recent energy and eco-friendly policies. The heat source of the thermoelectric device may include all kinds of heat such as solar heat, automobile waste heat, earth heat, body heat, and radioactive heat on earth.

The thermoelectric effect was discovered by Thomas Seebeck in the nineteenth century. Seebeck connected bismuth and copper, and disposed a compass therein. Seebeck demonstrated the thermoelectric effect for the first time by showing that a current is induced due to a temperature difference when one side of bismuth is heated to a high temperature, and a magnetic field generated due to the induced current allows the compass to operate.

A ZT (figure of merit) value is used as an indicator for estimating the thermoelectric efficiency. The ZT value is directly proportional to the square of the Seebeck coefficient and electric conductivity, and is inversely proportional to thermal conductivity. These are highly dependent on the inherent characteristics of a material. In the case of metal, since the Seebeck coefficient value is very low as a level of about several μN/K, and there is a proportional relation between the electric conductivity and the thermal conductivity according to the Wiedemann-Franz law, the ZT value may be impossible to rise when metal is used. On the other hand, thermoelectric devices that employ body heat and radioactive heat as a heat source have come to the market by diligent studies by scientists on semiconductor materials. However, the market size is still small. Examples of materials for thermoelectric devices that have been commercialized include $Bi_2Te_3$ used at normal and medium temperatures, and SiGe used at a high temperature. $Bi_2Te_3$ has a ZT value of about 0.7 at a normal temperature, and has a maximum ZT value of about 0.9 at a temperature of about 120° C. SiGe has a ZT value of about 0.1 at a normal temperature, and has a maximum ZT value of about 0.9 at a temperature of about 900° C.

Studies based on silicon that is a basic material in the semiconductor industry are also attracting attention. Since silicon has a ZT value of about 0.01 due to its high thermal conductivity of about 150 W/m·K, it has been known that it is difficult to utilize as a thermoelectric device. However, it has been recently reported that thermal conductivity of silicon nano-line grown by a chemical vapor deposition can be reduced to about 0.01 times or less, and therefore the ZT value approaches about 1.

However, the integration and commercialization of a silicon nano-line-based thermoelectric device utilizing a typical technology are confronted by difficulties, one of which may be absence of a nano-line manufacturing method that enables mass production. Most manufacturing methods include individually growing in a furnace by utilizing a catalyst or non-catalyst method. However, such an individual growing method has the following two limitations. First, nano-lines may not be consistently grown in one direction, and some nano-lines may be grown in an undesired direction to obstruct the growth of other nana-lines. This becomes a significant limitation in obtaining high-quality nano-lines. Second, nano-lines individually grown in a furnace are moved to a device, and then have to be attached to the device. That is, since the nano-lines and the device are not integrally manufactured, mass production is difficult to achieve. Also, since much time is spent in this course, the production cost considerably increases.

SUMMARY OF THE INVENTION

The present invention provides a thermoelectric device that can easily be manufactured and a method of forming the same, a temperature sensing sensor, and a heat-source image sensor using the same.

Embodiments of the present invention provide thermoelectric devices including: a first nanowire and a second nanowire on a substrate, the first nanowire and the second nanowire being separated from each other; a first silicon thin film connected to one end of the first nanowire; a second silicon thin film connected to one end of the second nanowire; and a third silicon thin film connected to the other ends of the first nanowire and the second nanowire, wherein the first nanowire and the second nanowire extend in a direction parallel to an upper surface of the substrate.

In some embodiments, the silicon thin films and the nanowires may be provided on the same plane.

In other embodiments, the silicon thin films and the nanowires may have the same thickness.

In still other embodiments, the thermoelectric device may further include: first, second, and third metal thin films electrically connected to the silicon thin films, respectively; and an absorber electrically connected to the third metal thin film.

In even other embodiments, the absorber may absorb heat, and may deliver the heat to the third silicon thin film through the third metal thin film.

In yet other embodiments, the first and second nanowire may include silicon.

In further embodiments, the first nanowire may include an n-type dopant, and the second nanowire may include a p-type dopant.

In still further embodiments, the first silicon thin film, the second silicon thin film, and the third silicon thin film may further include a doping region, respectively, and the doping region may form an ohmic contact with contacts connected to the first, second, and third metal thin films.

In even further embodiments, the first, second, and third metal thin films may include the same material.

In yet further embodiments, the first, second, and third metal thin films may include at least one of Cu, Al, Ti, Co, TiN, and W.

In yet further embodiments, the thermoelectric device may further include an insulation layer provided on the substrate, wherein the silicon thin films and the nanowires are disposed on the insulation layer.

In other embodiments of the present invention, temperature sensing sensors include: a thermoelectric device according to claim 1, the thermoelectric device converting thermal energy of a heat source into electrical energy; a central processing unit carrying out an operation by comparing the electrical energy with a temperature value of the heat source; and a data storage unit storing data calculated in the central processing unit, and exchanging data with the central processing unit.

In still other embodiments of the present invention, heat-source image sensors include: a plurality of unit pixels including an AND logic circuit, a switching device turned on by the AND logic circuit, and a thermoelectric device according to claim 1, respectively, the thermoelectric device being electrically connected to the switch device; a row multiplexer and a column multiplexer selecting the plurality of unit pixels and electrically connected to the AND logic circuit; a plurality of current amplifiers amplifying electrical energy of the thermoelectric device through the turned on switching device; and a display receiving a signal amplified by the current amplifier and outputting an image.

In even still other embodiments of the present invention, methods for forming a thermoelectric device include: sequentially forming an insulation layer and a silicon layer on a substrate; forming a photoresist pattern having a first linewidth on the silicon layer; forming a photoresist fine pattern having a second linewidth narrower than the first linewidth, by performing an ashing process on the photoresist pattern; and forming first and second nanowires by performing an etching process on the silicon layer using the photoresist fine pattern as a mask.

In some embodiments, the forming of the first and second nanowires may include: forming a first silicon thin film connected to one end of the first nanowire; forming a second silicon thin film connected to one end of the second nanowire; and forming a third silicon thin film connected to the other ends of the first and second nanowires.

In other embodiments, the method may further include: doping the first nanowire with an n-type dopant; and doping the second nanowire with a p-type dopant.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
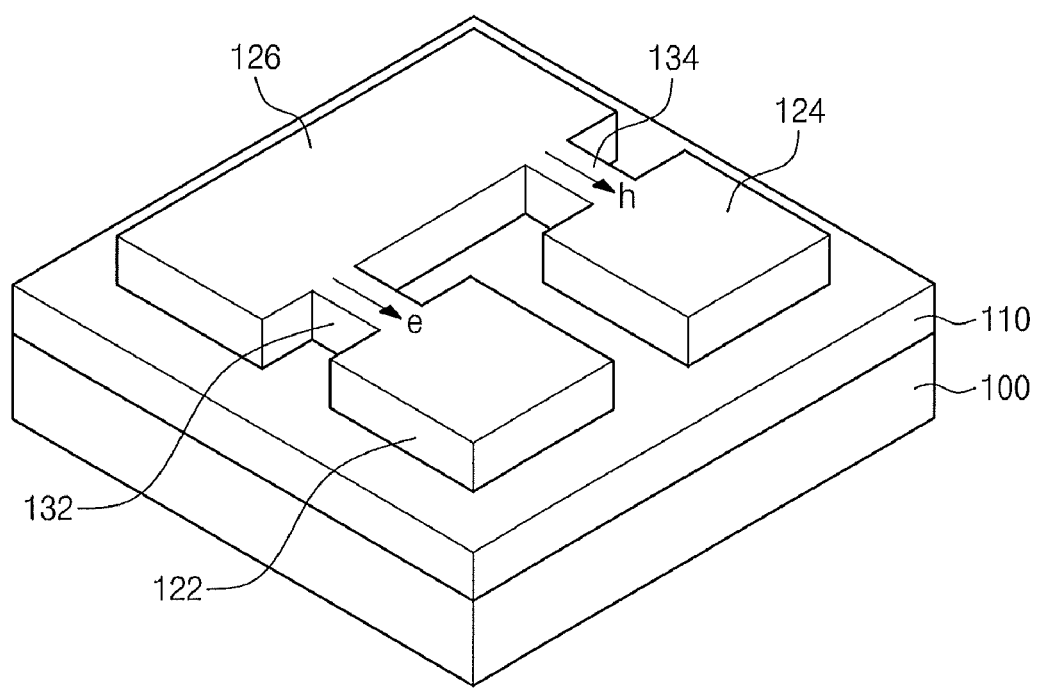
FIG. 1 is a perspective view illustrating a thermoelectric device according to an embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In the drawings, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Additionally, the embodiment in the detailed description will be described with sectional views as ideal exemplary views of the present invention. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be constructed as limited to the scope of the present invention. Also, though terms like a first, a second, and a third are used to describe various regions and layers in various embodiments of the present invention, the regions and the layers are not limited to these terms. These terms are used only to tell one region or layer from another region or layer. Therefore, a layer referred to as a first layer in one embodiment can be referred to as a second layer in another embodiment. An embodiment described and exemplified herein includes a complementary embodiment thereof.

In the following description, the technical terms are used only for explaining exemplary embodiments while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

Hereinafter, it will be described about an exemplary embodiment of the present invention in conjunction with the accompanying drawings.

FIG. 1 is a perspective view illustrating a thermoelectric device according to an embodiment of the present invention.

Referring to FIG. 1, an insulation layer 110 may be disposed on a substrate 100. The substrate 100 may be a silicon substrate or a Silicon On Insulator (SOI) substrate. The insulation layer 110 may be a silicon oxide provided on the substrate 100, or may be a buried oxide of a SOI substrate. A first nanowire 132 and a second nanowire 134 may be disposed on the insulation layer 110 to be separated from each other. The first nanowire 132 and the second nanowire 134 may extend in a direction parallel to the upper surface of the insulation layer 110.

A first silicon thin film 122 may be disposed to be connected to one end of the first nanowire 132, and second silicon thin film 124 may be disposed to be connected to one end of the second nanowire 134. A third silicon thin film 126 may be disposed to be connected to the other ends of the first and second nanowires 132 and 134. The first nanowire 132 may include an n-type dopant, and the second nanowire 134 may include a p-type dopant.

The first silicon thin film 122 may include an n-type dopant, and the second silicon thin film 124 may include a p-type dopant. The third silicon thin films 126 may include a p-type or n-type dopant. Specifically, a portion of the third silicon thin film 126 adjacent to the first nanowire 132 may include an n-type dopant, and a portion of the third silicon thin film 126 adjacent to the second nanowire 134 may include a p-type dopant.

The third silicon thin film 126 may be exposed to a heat-source to be heated. Accordingly, a current may be induced due to a temperature difference between the third silicon thin film 126 and the first silicon thin film 122, and between the third silicon thin film 126 and the second silicon thin film 124. That is, due to the temperature difference, electrons (e) may move from the third silicon thin film 126 to the first silicon thin film 124 through the first nanowire 132, and holes (h) may move from the third silicon thin film 126 to the second silicon thin film 122 through the second nanowire 134, thereby generating a clockwise current flow.

Figure 2:
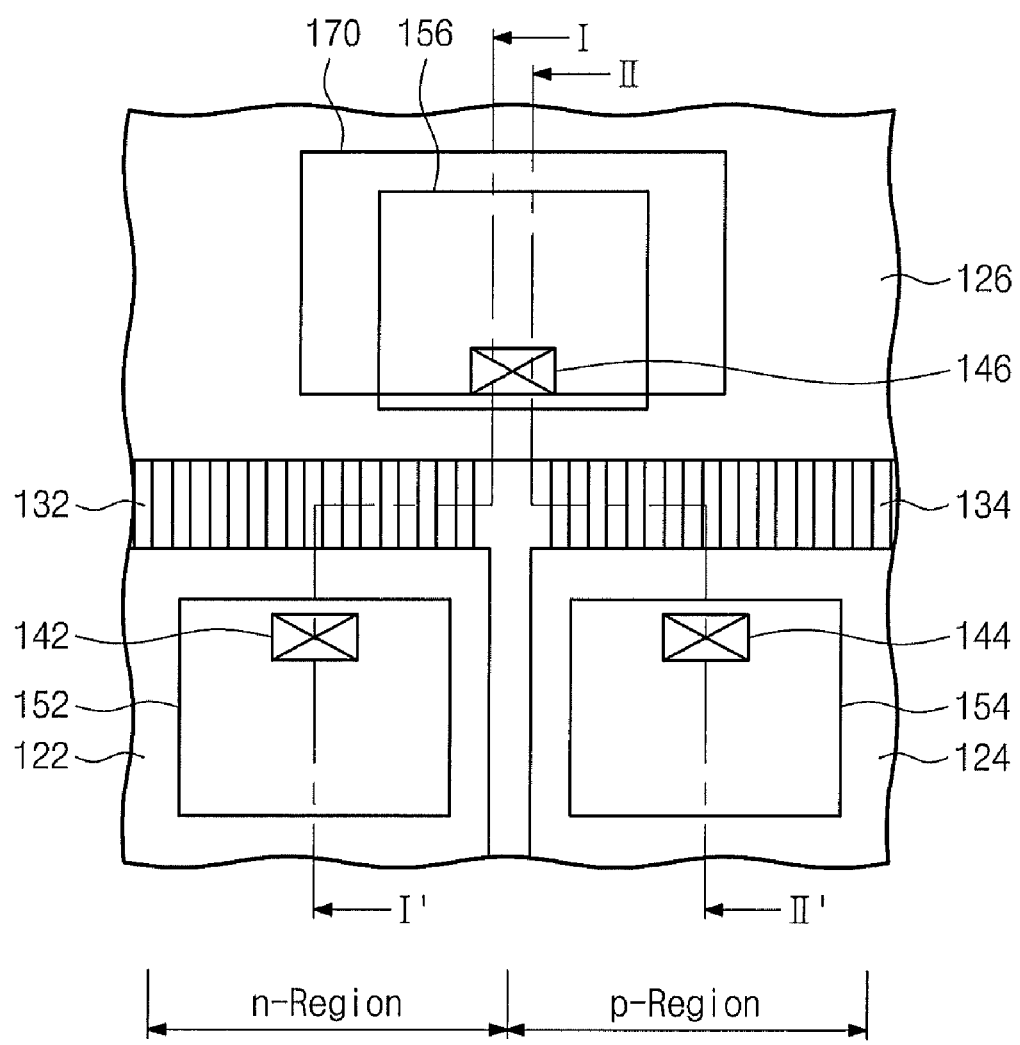
FIG. 2 is a plan view illustrating a thermoelectric device according to an embodiment of the present invention.
Figure 3A:
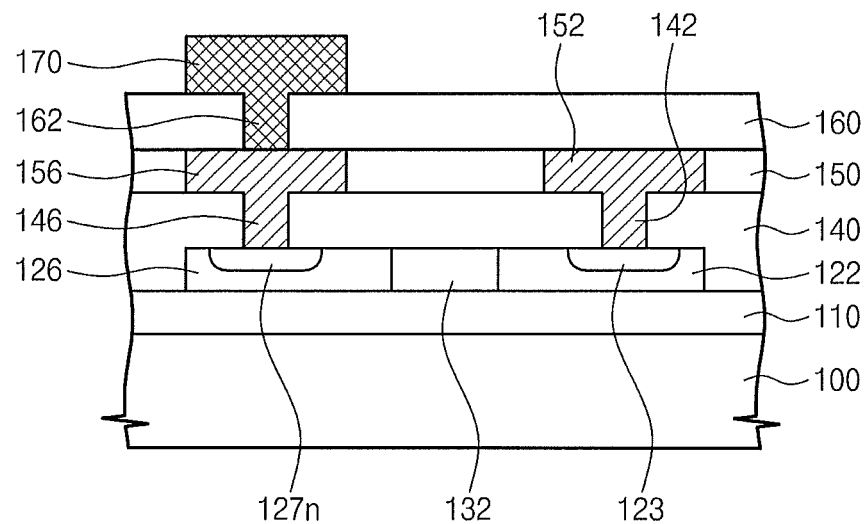
FIG. 3A is a cross-sectional view taken along line I-I' of FIG. 2.
Figure 3B:
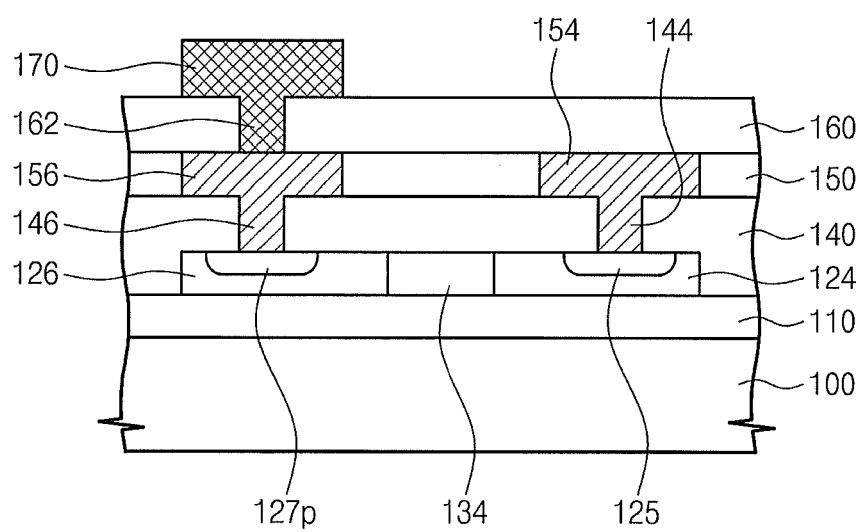
FIG. 3B is a cross-sectional view taken along line II-II' of FIG. 2.

FIG. 2 is a plan view illustrating a thermoelectric device according to an embodiment of the present invention. FIG. 3A is a cross-sectional view taken along line I-I' of FIG. 2. FIG. 3B is a cross-sectional view taken along line II-II' of FIG. 2.

Referring to FIGS. 2 through 3B, an insulation layer 110 may be provided on a substrate 100 including an n-region and a p-region. The substrate 100 may be a semiconductor substrate or a SIM substrate. The insulation layer 110 may include silicon oxide. The insulation layer 110 may be a buried oxide of a SOI substrate. A first nanowire 132 may be disposed on the insulation layer 110 of an n-region. A second nanowire 134 may be disposed on the insulation layer 110 of a p-region to be separated from the first nanowire 132.

A first silicon thin film 122 may be disposed on the insulation layer 110 to be connected to one end of the first nanowire 132. A second silicon thin film 124 may be disposed on the insulation layer 110 to be connected to one end of the second nanowire 134. A third silicon thin film 126 may be disposed on the insulation layer 110 to be connected to the other ends of the first and second nanowires 132 and 134. The first and second nanowires 132 and 134 may extend in a direction parallel to the upper surface of the substrate 100 or the insulation layer 110.

The first and second nanowires 132 and 134 may include silicon. The first nanowire 132 may include an n-type dopant, and the second nanowire 134 may include a p-type dopant. The silicon thin films 122, 124 and 126 and the nanowires 132 and 134 may be provided on the same plane. Also, the silicon thin films 122, 124 and 126 and the nanowires 132 and 134 may have the same thickness.

The first silicon thin film 122 may include a first doping region 123, and the second silicon thin film 124 may include a second doping region 125. Also, the third thin film 126 may include a third doping region 127. The first, second, and third doping regions 123, 125 and 127 may include a dopant, respectively. The first doping region 123 may have the same type of dopant as the first silicon thin film 122, and the second doping region 125 may have the same type of dopant as second silicon thin film 124. The first silicon thin film 122 and the first doping region 123 may have an n-type dopant. The second silicon thin film 124 and the second doping region 125 may have a p-type dopant. The third doping region 127 may include an n-type doping region 127n provided in the n-region, and a p-type doping region 127p provided in the p-region. The third silicon thin film 126 disposed in the n-region may have an n-type dopant, and the third silicon thin film 126 disposed in the p-region may have a p-type dopant.

A first interlayer dielectric 140 may be disposed to cover the silicon thin films 122, 124 and 126 and the nanowires 132 and 134.

The first interlayer dielectric 140 may include silicon oxide. First, second, and third metal contact 142, 144 and 146 may be disposed in the first interlayer dielectric 140 to be connected to the first, second, and third silicon thin films 122, 124 and 126, respectively. Unlike that shown in FIG. 2, the third metal contact 146 may be divided into an n-type metal contact provided in the n-region and a p-type metal contact provided in the p-region.

A second interlayer dielectric 150 may be disposed on the first interlayer dielectric 140. The second interlayer dielectric 150 may include the same material as the first interlayer dielectric 140. First metal thin film 152, second metal thin film 154, and third metal thin film 156 may be disposed in the second interlayer dielectric 150 to be electrically connected to the first, second, and third metal contacts 142, 144 and 146, respectively. The first, second, and third metal thin films 152, 154 and 156 may include the same material. The first, second, and the third metal thin films 152, 154 and 156 may include at least one of Cu, Al, Ti, Co, TiN, and W. The first, second, and third metal thin films 152, 154 and 156 may include the same material as the first, second, and third metal contacts 142, 144 and 146.

A third interlayer dielectric 160 may be disposed on the second interlayer dielectric 150 and the metal thin films 152, 154 and 156. The third interlayer dielectric 160 may include the same material as the second interlayer dielectric 150. A contact 162 may be disposed in the third interlayer dielectric 160 to contact the third metal film 156. An absorber 170 may be disposed on the third interlayer dielectric 160 to be connected to the contact 162. The absorber 170 may serve to absorb heat from the outside. The absorber 170 may include titanium oxide. The contact 162 may include the same material as the absorber 170. The absorber 170 may deliver heat to the third silicon thin film 126 to form a temperature difference between the third silicon thin film 126 and the first silicon thin film 122 and between the third silicon thin film 126 and the second silicon thin film 124.

Figure 4:
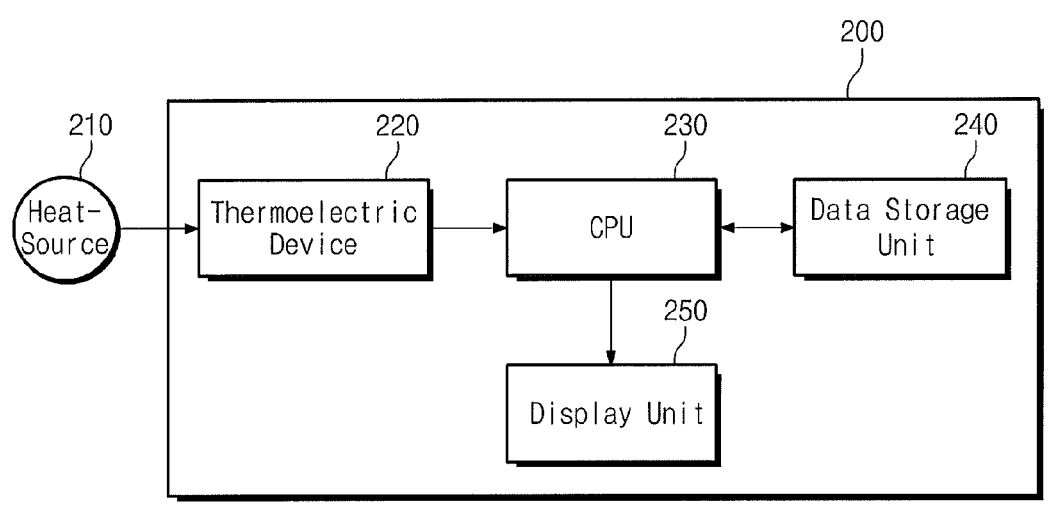
FIG. 4 is a diagram illustrating a temperature sensing sensor according to an embodiment of the present invention.

FIG. 4 is a diagram illustrating a temperature sensing sensor according to an embodiment of the present invention.

Referring to FIG. 4, a temperature sensing sensor 200 may include a thermoelectric device 220 that absorbs thermal energy from a heat source 210 to convert it into electrical energy. The thermoelectric device 220 may include components described with reference to FIGS. 2 through 3B. The value of the electrical energy generated by the heat source 210 and the thermoelectric device 220 may be calculated in a central processing unit 230. The central processing unit 230 may store a relation between the temperature of the heat source 210 and the value of the electrical energy in a data storage unit 240. The temperature sensing sensor 200 may include a display unit 250 that displays temperature according to the temperature of the heat source 210. According to an embodiment of the present invention, the temperature sensing sensor 200 may sense the temperature of the heat source 210 using a silicon nanowire.

Figure 5:
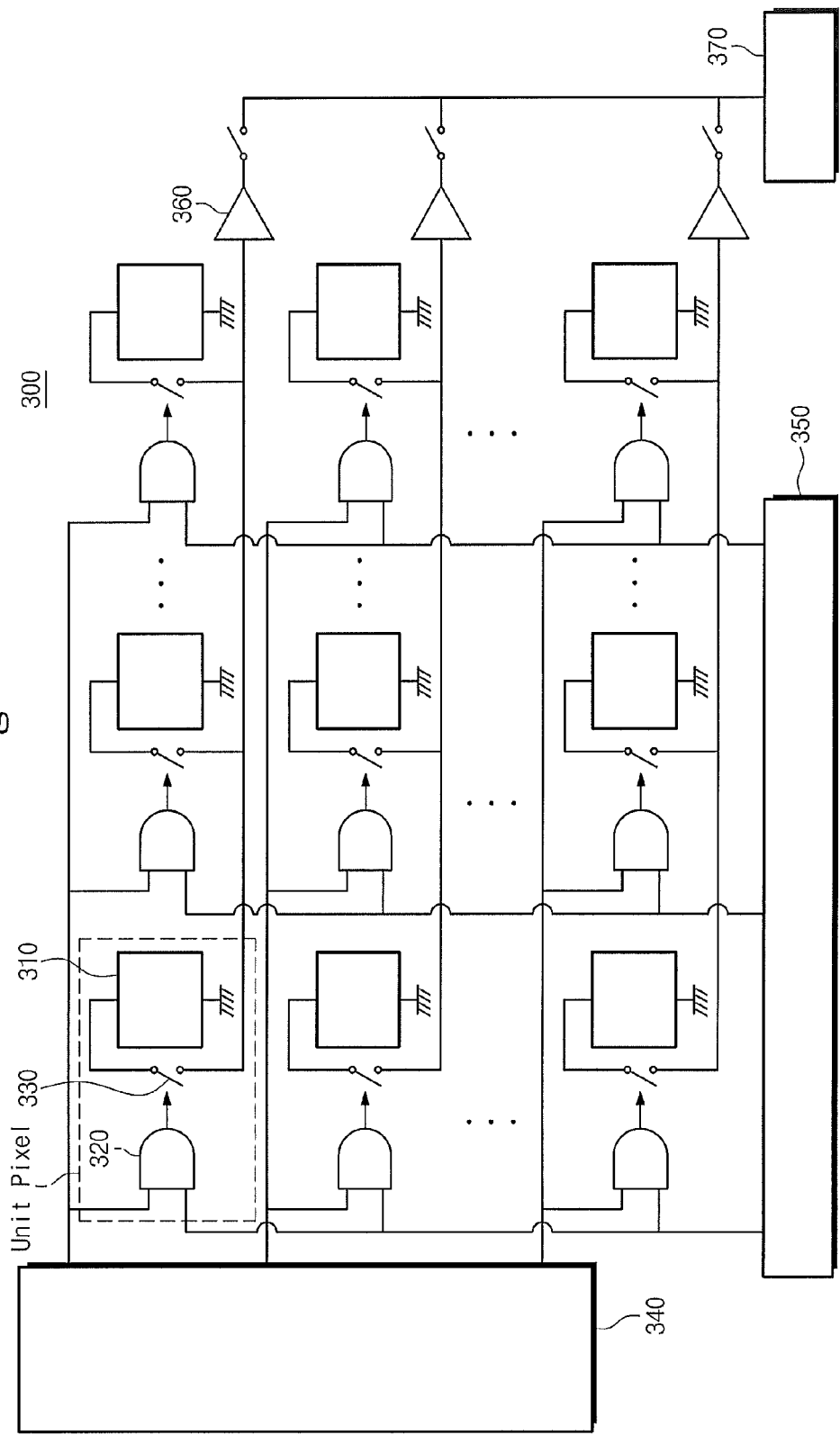
FIG. 5 is a circuit diagram illustrating a heat-source image sensor according to an embodiment of the present invention.

FIG. 5 is a circuit diagram illustrating a heat-source image sensor according to an embodiment of the present invention.

Referring to FIG. 5, a heat-source image sensor 300 may include a plurality of unit pixels including a thermoelectric device 310 as described in FIGS. 2 through 3B, an AND logic circuit 320, and a switching device 330. The switching device 330 may be turned on by the AND logic circuit 320. A row multiplexer 340 and a column multiplexer 350 may be provided to select the plurality of unit pixels and to be electrically connected to the AND logic circuit 320. Thermal energy corresponding to the location of the thermoelectric devices 310 may be converted into electrical energy by the thermoelectric devices 310 of the selected unit pixels. When the switching devices 330 of the selected unit pixels are turned on, the electrical energy generated by the thermoelectric device 310 may be outputted. The outputted electrical energy may be amplified in a low noise current amplifier 360, and then may be converted into a voltage value. The generated voltage value may be implemented in an image by the display 370.

FIGS. 6A through 7C are diagrams illustrating a method of forming a thermoelectric device according to an embodiment of the present invention. FIGS. 6A through 6F are diagrams illustrating a method of forming a nanowire. For convenience of explanation, a pair of nanowires will be illustrated.

Figure 6A:
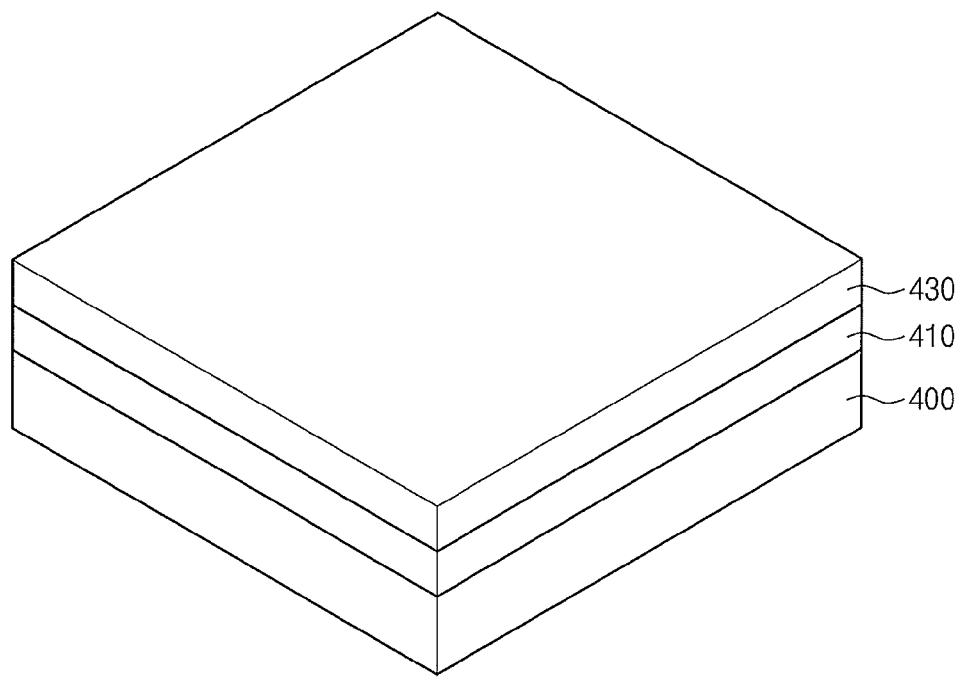
FIGS. 6A through 7C are diagrams illustrating a method of forming a thermoelectric device according to an embodiment of the present invention.

Referring to FIG. 6A, an insulation layer 410 may be formed on a substrate 400. The insulation layer 410 may be formed of silicon oxide. A silicon layer 430 may be formed on the insulation layer 410. Otherwise, the substrate 400, the insulation layer 410, and the silicon layer 430 may be prepared using a SOI substrate. The thickness of the silicon layer 430 may be thinned to several nanometers, for example, about 40 nm. The thinning of the silicon layer 430 may include repeating a thermal oxidation process and an oxide layer removal process. The oxide layer removal process may include a wet etching process.

Figure 6B:
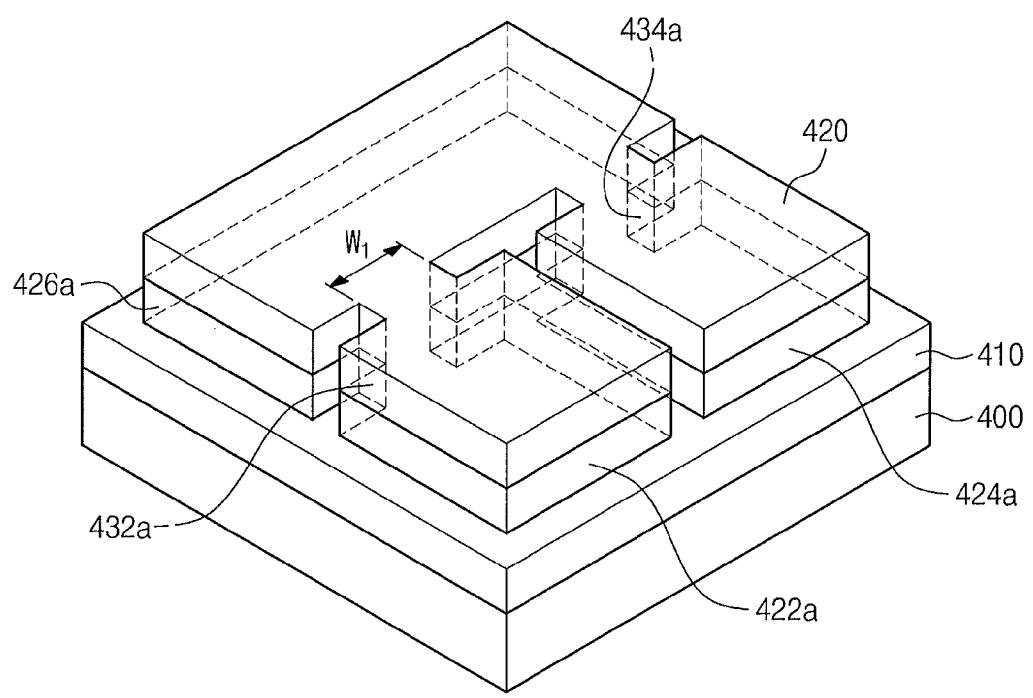

Referring to FIG. 6B, a photoresist pattern 420 may be formed on the silicon layer 430. A first minimum linewidth W1 of the photoresist pattern 420 may be about 180 nm. The photoresist pattern 420 may be formed by a stepper using a KrF excimer laser. A first preliminary silicon thin film 422a, a second preliminary silicon thin film 424a, and a third preliminary silicon thin film 426a, and a first preliminary nanowire 432a and a second preliminary nanowire 434a may be formed by performing an etching process using the photoresist pattern 420 as a mask.

Figure 6C:
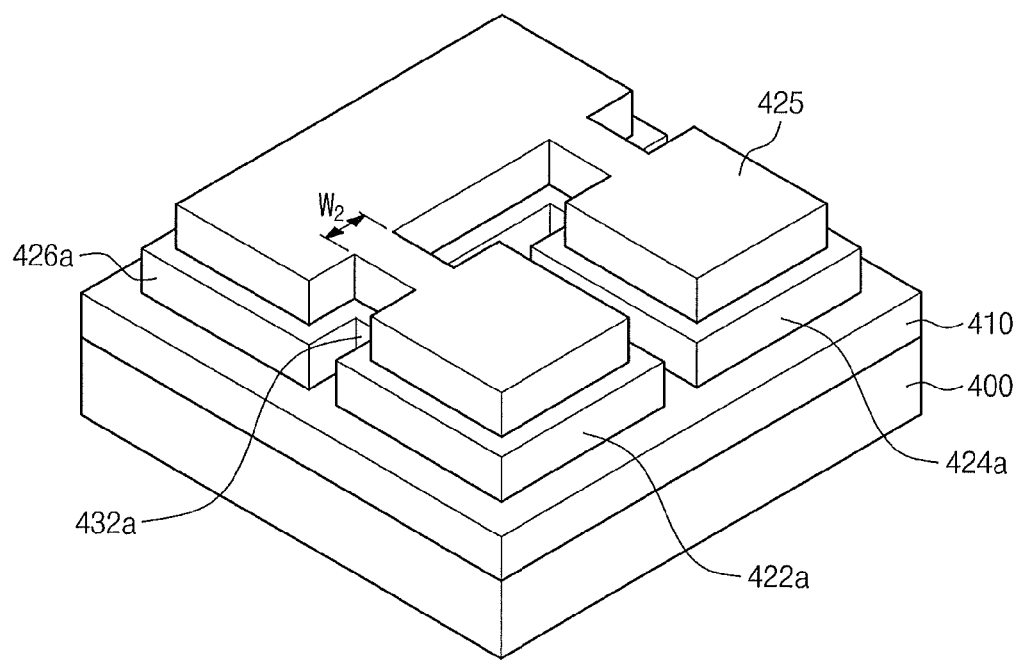

Referring to FIG. 6C, a photoresist fine pattern 425 having a second minimum linewidth W2 narrower than the first minimum linewidth W1, by performing an ashing process on the photoresist pattern 420. The second minimum linewidth W2 may be about 30 nm The ashing processing may be an oxygen ashing process.

Figure 6D:
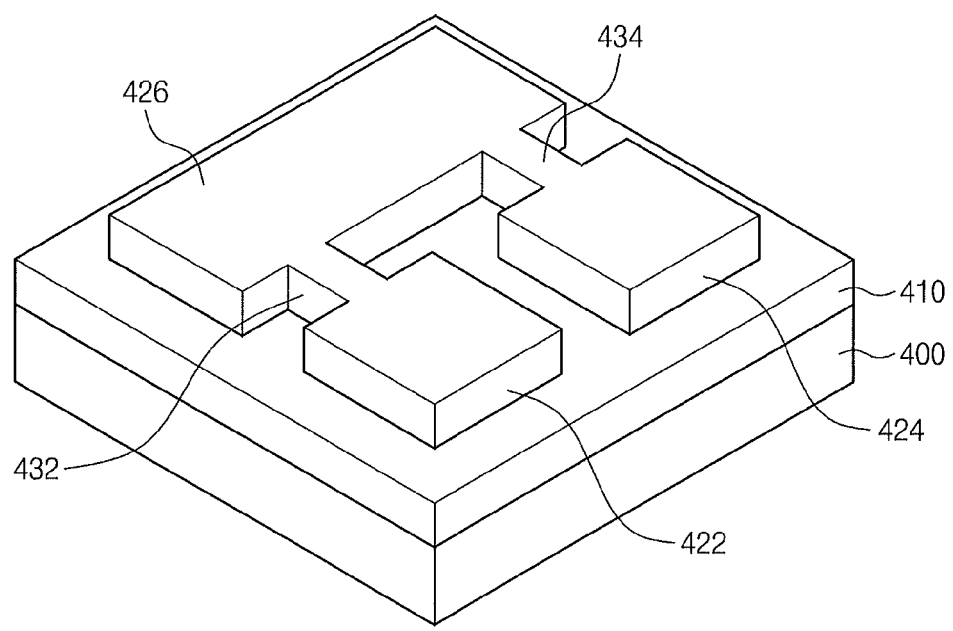

Referring to FIG. 6D, the silicon thin film 422, the second silicon thin film 424 and the third silicon thin film 426, and the first nanowire 432 and the second nanowire 434 may be formed by performing an etching process on the first preliminary silicon thin film 422a, the second preliminary silicon thin film 424a and the third preliminary silicon thin film 426a, and the first preliminary nanowire 432a and the second preliminary nanowire 434a using the photoresist fine pattern 425 as a mask. The first nanowire 432 and the second nanowire 434 may have a linewidth of about 30 nm. The first and second nanowires 432 and 434 may extend in a direction parallel to the upper surface of the substrate 400.

The silicon thin films 422, 424 and 426, and the nanowires 432 and 434 may be formed on the substantially same plane. This is because the silicon thin films 422, 424 and 426, and the nanowires 432 and 434 are simultaneously formed by one photoresist fine pattern 425. Also, the silicon thin films 422, 424 and 426, and the nanowires 432 and 434 may have the same thickness.

Figure 6E:
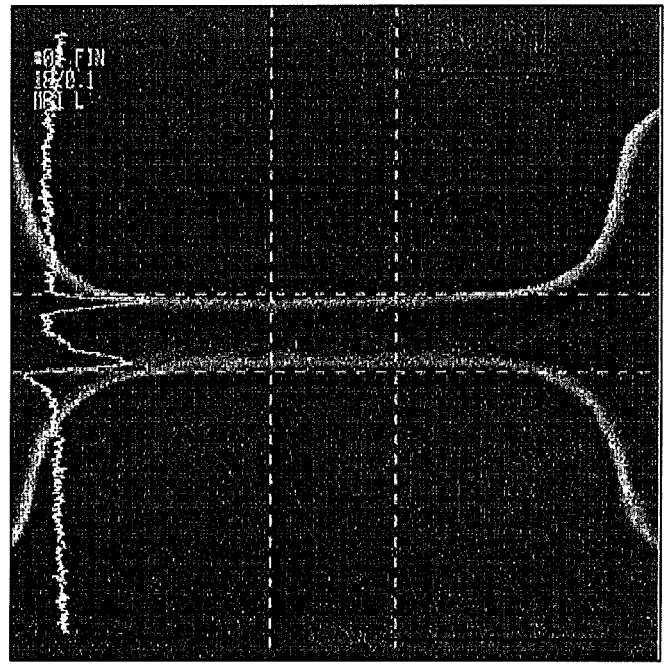
Figure 6F:
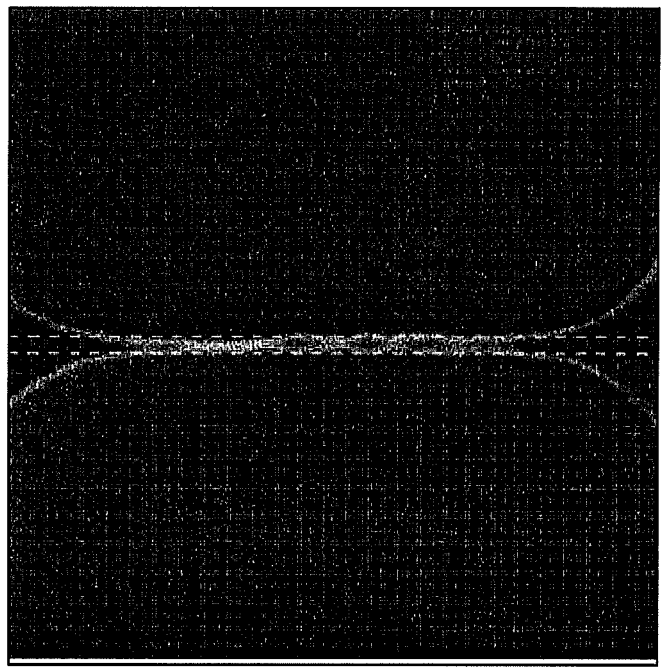

FIGS. 6E and 6F are scanning electron microscope (SEM) pictures illustrating the first and second nanowires 432 and 434 before and after the ashing process, respectively. The linewidth of the nanowire may be about 160.9 nm in FIG. 6E, while the linewidth of the nanowired may be about 31.1 nm in FIG. 6F after the ashing process.

Figure 7A:
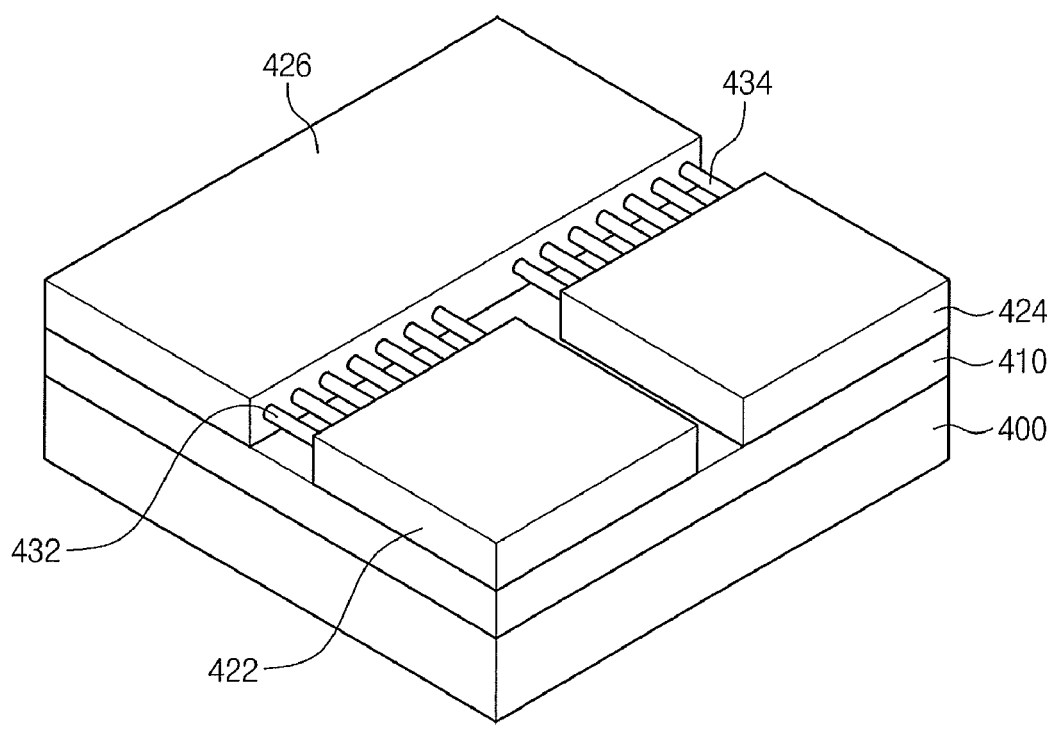
Figure 7B:
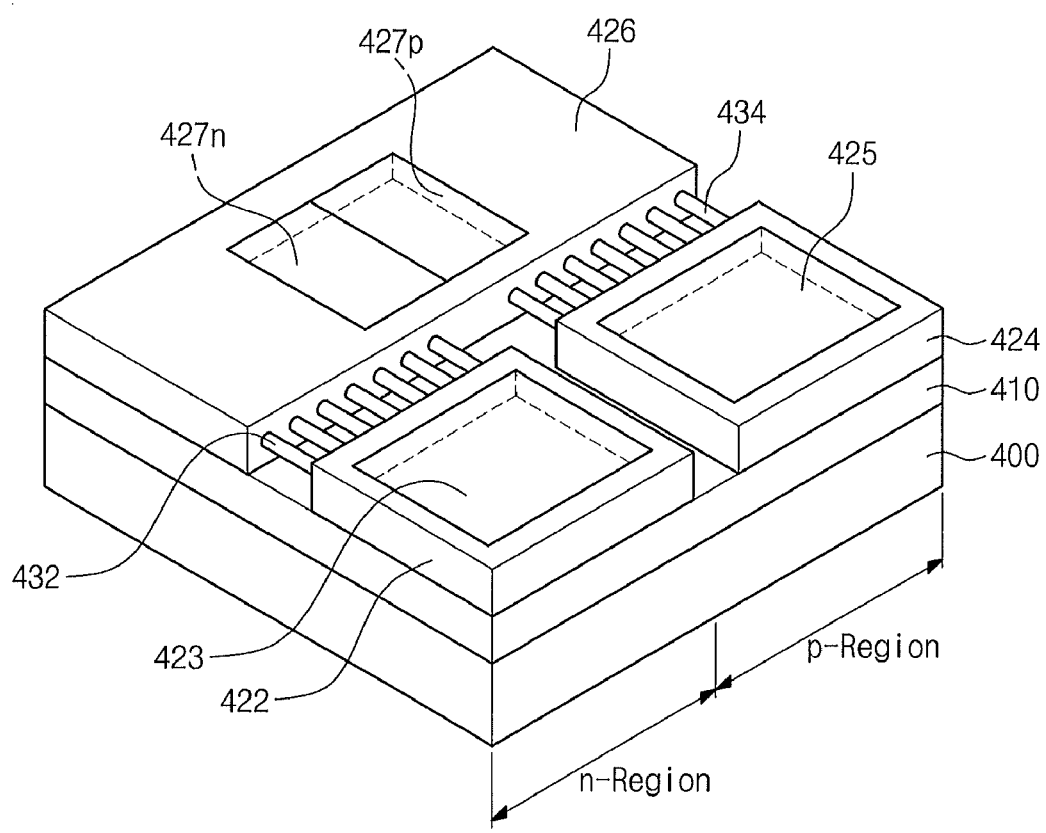
Figure 7C:
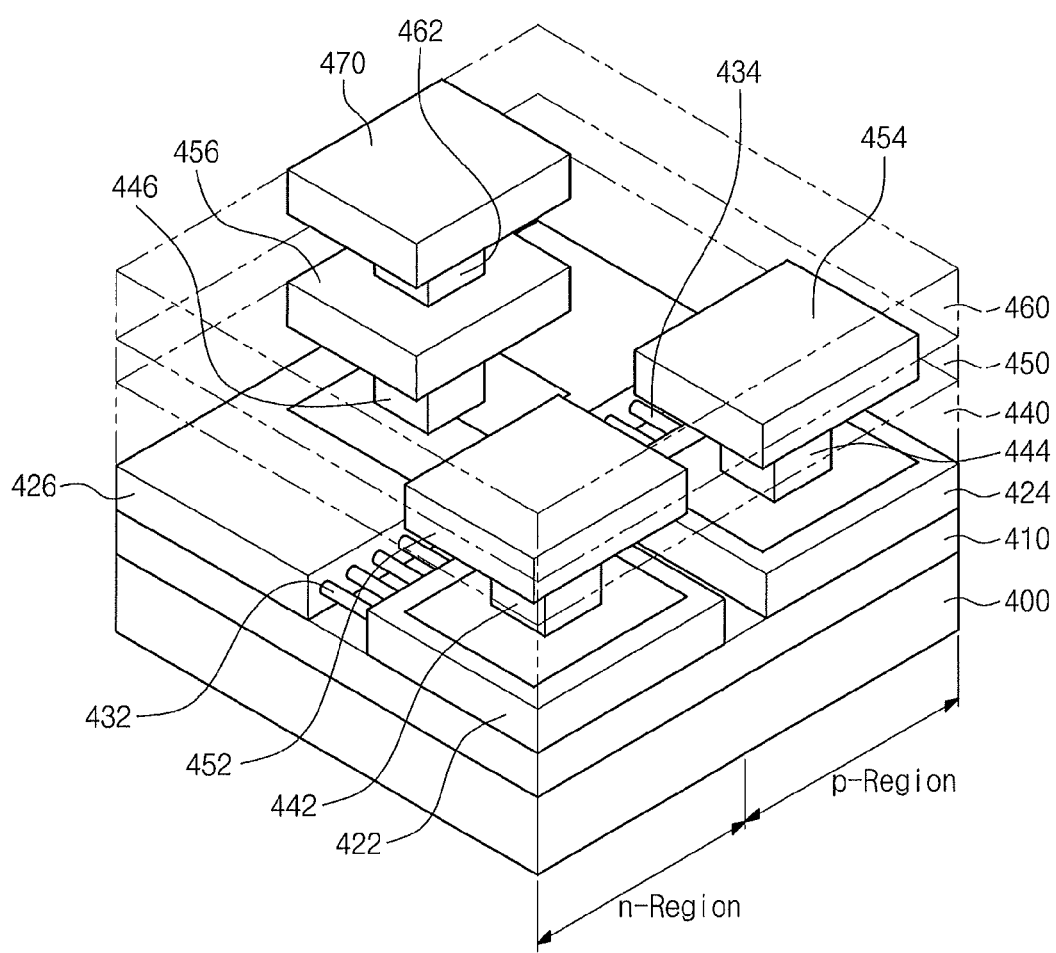

FIGS. 7A through 7C are diagram illustrating a process after the first and second nanowires 432 and 434 are formed. In the drawings, the first and second nanowires 432 and 434 have been shown in plurality, respectively.

Referring to FIG. 7A, the first nanowire 432 may be doped with an n-type dopant. The substrate 400 may include an n-region by doping the first nanowire 432 with the n-type dopant. The first silicon thin film 422 and a portion of the third silicon thin film 426 adjacent to the first nanowire 432 may be provided in the n-region. The second nanowire 434 may be doped with a p-type dopant. The substrate 400 may include a p-region by doping the second nanowire 434 with the p-type dopant. The second silicon thin film 424 and a portion of the third silicon thin film 426 adjacent to the second nanowire 434 may be provided in the p-region.

Referring to FIG. 7B, a first doping region 423 for an ohmic contact may be formed in the first silicon thin film 422, and a second doping region 425 for an ohmic contact may be formed in the second silicon thin film 424. The first doping region 423 may include an n-type dopant, and the second doping region 425 may include a p-type dopant. A third doping region 427n for an ohmic contact may be formed in an n-type region of the third silicon thin film 426, and a fourth doping region 427p for an ohmic contact may be formed in a p-type region of the third silicon thin film 426. The third doping region 427n may include an n-type dopant, and the fourth doping region 427p may include a p-type dopant. Here, the ohmic contact means that a resistance is reduced between a silicon thin film and a metal contact to be described below or a metal thin film.

Referring to FIG. 7C, a first interlayer dielectric 440 may be formed to cover the silicon thin films 422, 424 and 426, and the nanowires 432 and 434. The first interlayer dielectric 440 may be formed of silicon oxide. A first metal contact 442 may be formed in the first interlayer dielectric 440 to contact the first doping region 423, and a second metal contact 444 may be formed to contact the second doping region 425. Also, a third metal contact 446 may be formed to contact the third doping region 427n and the fourth doping region 427p. The third metal contact 446, unlike that shown in FIG. 7C, may be divided into a metal contact contacting the third doping region 427n, and a metal contact contacting the fourth doping region 427p.

A second interlayer dielectric layer 450 may be formed on the first interlayer dielectric 440. The second interlayer dielectric 450 may be formed of the same material as the first interlayer dielectric 440, for example, silicon oxide. A first metal thin film 452 contacting the first metal contact 442, a second metal thin film 454 contacting the second metal contact 444, and a third metal thin film 456 contacting the third metal contact 446 may be formed in the second interlayer dielectric 450. The first, second, and third metal thin films 452, 454 and 456 may be formed of the same material. The first, second, and third metal thin films 452, 454 and 456 may be formed of the same material as the first, second, and third metal contacts 442, 444 and 446. For example, the first, second, and third metal thin films 452, 454 and 456 may be formed of at least one of Cu, Al, Ti, Co, TiN, and W.

A third interlayer dielectric layer 460 may be formed on the second interlayer dielectric 450. For example, the third interlayer dielectric layer 460 may be formed of silicon oxide. A contact 462 contacting the third metal thin film 456 may be formed in the third interlayer dielectric 460. An absorber 470 connected to the contact 462 may be formed on the third interlayer dielectric 460. The absorber 470 may be formed of titanium oxide. The contact 462 may be formed of the same material as the absorber 470.

According to an embodiment, the first nanowire 432 and the second nanowire 434 may be formed a photolithography process and an ashing process. That is, the first nanowire 432 and the second nanowire 434 may not be separately formed in a furnace, but may be formed using a semiconductor process (CMOS process). Accordingly, processing time for forming a nanowire may be reduced, and mass production may be achieved. Also, uniformity of the nanowire can be secured to improve the performance of a thermoelectric device. The central processing unit 230, the data storage unit 240, the AND logic circuit 320, the switching device 330, the row multiplexer 340, the column multiplexer 350, and the low noise current amplifier 360 described in FIG. 4 may include a CMOS device, and may be formed by the CMOS process described above.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A thermoelectric device comprising:
a first nanowire and a second nanowire on a substrate, the first nanowire and the second nanowire being separated from each other;
a first silicon thin film connected to one end of the first nanowire;
a second silicon thin film connected to one end of the second nanowire; and
a third silicon thin film connected to the other ends of the first nanowire and the second nanowire,
wherein the first nanowire and the second nanowire extend in a direction parallel to an upper surface of the substrate.

2. The thermoelectric device of claim 1, wherein the silicon thin films and the nanowires are provided on the same plane.

3. The thermoelectric device of claim 1, wherein the silicon thin films and the nanowires have the same thickness.

4. The thermoelectric device of claim 1, further comprising:
first, second, and third metal thin films electrically connected to the silicon thin films, respectively; and
an absorber electrically connected to the third metal thin film.

5. The thermoelectric device of claim 4, wherein the absorber absorbs heat, and delivers the heat to the third silicon thin film through the third metal thin film.

6. The thermoelectric device of claim 4, wherein the first and second nanowire comprises silicon.

7. The thermoelectric device of claim 6, wherein the first nanowire comprises an n-type dopant, and the second nanowire comprises a p-type dopant.

8. The thermoelectric device of claim 4, wherein the first silicon thin film, the second silicon thin film, and the third silicon thin film further comprise a doping region, respectively, and the doping region forms an ohmic contact with contacts connected to the first, second, and third metal thin films.

9. The thermoelectric device of claim 4, wherein the first, second, and third metal thin films comprise the same material.

10. The thermoelectric device of claim 9, wherein the first, second, and third metal thin films comprise at least one of Cu, Al, Ti, Co, TiN, and W.

11. The thermoelectric device of claim 1, further comprising an insulation layer provided on the substrate, wherein the silicon thin films and the nanowires are disposed on the insulation layer.

12. A temperature sensing sensor comprising:
a thermoelectric device according to claim 1, the thermoelectric device converting thermal energy of a heat source into electrical energy;
a central processing unit carrying out an operation by comparing the electrical energy with a temperature value of the heat source; and
a data storage unit storing data calculated in the central processing unit, and exchanging data with the central processing unit.

13. A heat-source image sensor comprising:
a plurality of unit pixels comprising an AND logic circuit, a switching device turned on by the AND logic circuit, and a thermoelectric device according to claim 1, respectively, the thermoelectric device being electrically connected to the switch device;
a row multiplexer and a column multiplexer selecting the plurality of unit pixels and electrically connected to the AND logic circuit;
a plurality of current amplifiers amplifying electrical energy of the thermoelectric device through the turned on switching device; and
a display receiving a signal amplified by the current amplifier and outputting an image.

14. A method of forming a thermoelectric device, comprising:
sequentially forming an insulation layer and a silicon layer on a substrate;
forming a photoresist pattern having a first linewidth on the silicon layer;
forming a photoresist fine pattern having a second linewidth narrower than the first linewidth, by performing an ashing process on the photoresist pattern;
forming first and second nanowires by performing an etching process on the silicon layer using the photoresist fine pattern as a mask; and
wherein the forming of the first and second nanowires comprises: forming a first silicon thin film connected to one end of the first nanowire; forming a second silicon thin film connected to one end of the second nanowire; and forming a third silicon thin film connected to the other ends of the first and second nanowires.

15. The method of claim 14, further comprising:
doping the first nanowire with an n-type dopant; and
doping the second nanowire with a p-type dopant.

* * * * *